(12) United States Patent
Norouzpourshirazi et al.

(10) Patent No.: US 12,047,097 B2
(45) Date of Patent: Jul. 23, 2024

(54) BEYOND-THE-RAILS SWITCHED-CAPACITOR FLOATING FRONT END WITH OVER-VOLTAGE PROTECTION

(71) Applicant: Cirrus Logic International Semiconductor Ltd., Edinburgh (GB)

(72) Inventors: Arashk Norouzpourshirazi, Austin, TX (US); Stephen T. Hodapp, Austin, TX (US); Ravi K. Kummaraguntla, Austin, TX (US); Paul Wilson, Linlithgow (GB); Axel Thomsen, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 212 days.

(21) Appl. No.: 17/885,126

(22) Filed: Aug. 10, 2022

(65) Prior Publication Data
US 2024/0056095 A1 Feb. 15, 2024

(51) Int. Cl.
| H03M 3/00 | (2006.01) |
| G11C 27/02 | (2006.01) |
| H02M 3/07 | (2006.01) |
| H03K 17/06 | (2006.01) |
| H03M 1/12 | (2006.01) |

(52) U.S. Cl.
CPC ........... *H03M 3/496* (2013.01); *G11C 27/024* (2013.01); *H02M 3/07* (2013.01); *H03K 17/063* (2013.01); *H03M 1/1245* (2013.01); *H02M 3/076* (2021.05)

(58) Field of Classification Search
CPC ...... H03M 3/496; H03M 1/1245; H02M 3/07; H02M 3/076; G11C 27/024; H03K 17/063
USPC .................................................. 341/143, 155
See application file for complete search history.

(56) References Cited

U.S. PATENT DOCUMENTS

| 7,253,675 B2* | 8/2007 | Aksin ................... H03K 17/063 327/390 |
| 7,397,284 B1* | 7/2008 | Liu ................ H03K 19/018528 326/88 |
| 2015/0109161 A1 | 4/2015 | Trampitsch |

FOREIGN PATENT DOCUMENTS

EP   3573235 A1   11/2019

OTHER PUBLICATIONS

Combined Search and Examination Report under Sections 17 and 18(3), UKIPO, Application No. GB2302611.5, mailed Aug. 18, 2023.

* cited by examiner

*Primary Examiner* — Khai M Nguyen
(74) *Attorney, Agent, or Firm* — Jackson Walker L.L.P.

(57) ABSTRACT

A system may include a switched-capacitor analog front end comprising a plurality of switches for sampling an analog physical quantity and a bootstrap generation network electrically coupled to the plurality of switches and configured to generate a bootstrap sampling clock for controlling the plurality of switches and generate a floating supply voltage for the bootstrap sampling clock based on the analog physical quantity.

25 Claims, 1 Drawing Sheet

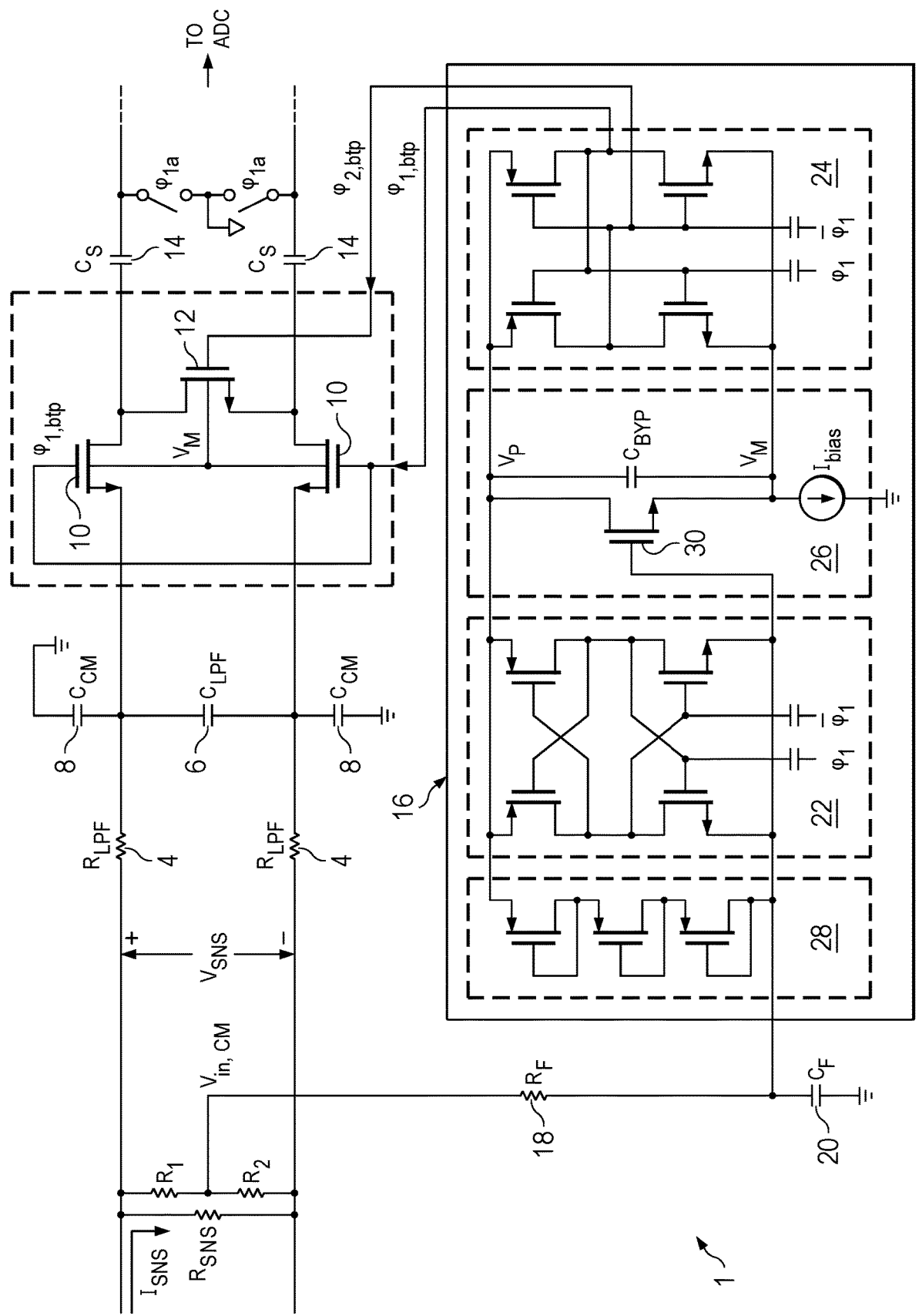

BEYOND-THE-RAILS SWITCHED-CAPACITOR FLOATING FRONT END WITH OVER-VOLTAGE PROTECTION

FIELD OF DISCLOSURE

The present disclosure relates in general to methods and systems for implementing a switched-capacitor floating front end configured to sample input signals higher in magnitude than available supply rails.

BACKGROUND

Delta-sigma modulators are typically used in electronic circuits such as analog-to-digital converters (ADCs). Often, such ADCs employ an anti-aliasing filter to filter an analog input signal that may be sampled by a sampling network at the input of the delta-sigma modulator for conversion into an equivalent digital signal by the ADC. An example of such a sampling network is a switched capacitor circuit.

Such a switched capacitor circuit may use bootstrapped switches, as known in the art. It may be desirable to implement beyond-the-rails switching in a switched capacitor circuit, wherein a switch is capable of passing a signal higher in magnitude than voltage rails of the clock generation circuit of the bootstrapped circuit. However, traditional approaches present a challenge to implementing beyond-the-rails switching.

SUMMARY

In accordance with the teachings of the present disclosure, the disadvantages and problems associated with existing approaches for bootstrapped switching may be reduced or eliminated.

In accordance with embodiments of the present disclosure, a system may include a switched-capacitor analog front end comprising a plurality of switches for sampling an analog physical quantity and a bootstrap generation network electrically coupled to the plurality of switches and configured to generate a bootstrap sampling clock for controlling the plurality of switches and generate a floating supply voltage for the bootstrap sampling clock based on the analog physical quantity.

In accordance with these and other embodiments of the present disclosure, a method may include, in a system comprising a switched-capacitor analog front end comprising a plurality of switches for sampling an analog physical quantity, generating a bootstrap sampling clock for controlling the plurality of switches and generating a floating supply voltage for the bootstrap sampling clock based on the analog physical quantity.

In accordance with these and other embodiments of the present disclosure, a method may include, a bootstrap generation network configured to electrically coupled to a plurality of switches of a switched-capacitor analog front end for sampling an analog physical quantity, may include circuitry configured to generate a bootstrap sampling clock for controlling the plurality of switches and circuitry configured to generate a floating supply voltage for the bootstrap sampling clock based on the analog physical quantity.

Technical advantages of the present disclosure may be readily apparent to one having ordinary skill in the art from the FIGURES, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

THE FIGURE illustrates a circuit diagram of an example beyond-the-rails switched-capacitor floating front end with over-voltage protection, in accordance with embodiments of the present disclosure.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

THE FIGURE illustrates a circuit diagram of an example beyond-the-rails switched-capacitor floating front end 1 with over-voltage protection, in accordance with embodiments of the present disclosure. In operation, beyond-the-rails switched-capacitor floating front end 1 may operate as an analog front end for current-sensing circuitry. In operation, beyond-the-rails switched-capacitor floating front end 1 may sense a differential sense voltage V SNS indicative of a current Is N s flowing through a sense resistor 2 having a resistance of $R_{SNS}$ (e.g., $V_{SNS}=I_{SNS} \cdot R_{SNS}$, in accordance with Ohm's Law, and $R_{SNS} \ll R_1+R_2$). A low-pass filter comprising filter resistors 4, filter capacitor 6, and filter capacitors 8 may low-pass filter differential sense voltage $V_{SNS}$. A switched-capacitor sampling circuit comprising bootstrapped switches 10 and 12 and sampling capacitors 14 may sample such low-pass filtered differential sense voltage in accordance with a bootstrap clock generated by bootstrap generation network 16 and having phases $\varphi_{1,btp}$ and $\varphi_{2,btp}$. Such sampled signal may be input to other processing circuitry, for example an analog-to-digital converter configured to generate a digital equivalent of the sampled analog signal.

As also shown in THE FIGURE, bootstrap generation network 16 may receive as its input a common mode voltage $V_{in,CM}$ of differential sense voltage V SNS filtered by a replica of the low-pass filter for filtering differential sense voltage $V_{SNS}$. Such replica low-pass filter may include a resistor 18 analogous to filter resistors 4 and a capacitor 20 analogous (but not necessarily equal) to filter capacitors 8. Such replica low-pass filter may minimize loading of the main filter path by charge pump circuitry of bootstrap generation network 16.

As further shown in THE FIGURE, bootstrap generation network 16 may include a main charge pump 22, one or more load charge pumps 24 (only one load charge pump is depicted in THE FIGURE for purposes of clarity and exposition), tracking assist circuit 26, and protection clamp 28 comprising one or more diode-connected transistors (protection clamp 28 is shown in THE FIGURE as comprising three diode-connected transistors for purposes of clarity and exposition). Main charge pump 22 may generate a floating high supply voltage $V_P$ with respect to the filtered common mode voltage $V_{in,CM}$, such that $V_P = V_{in,CM} + kV_{DD}$, wherein k is a gain of main charge pump 22 and may be determined by an output impedance of main charge pump 22 and the loading introduced by the one or more load charge pumps 24 and a bias current of tracking assist bias current, and $V_{DD}$ is the rail voltage of sampling clock signal $\varphi_1$.

Main charge pump 22 and floating high supply voltage $V_P$ may be loaded by load charge pump(s) 24, wherein load charge pump 24 may comprise cross-coupled inverters that use floating high supply voltage $V_P$ as their positive floating supply and operate as clock level shifters to generate bootstrap clock signals $\varphi_{1,btp}$ and $\varphi_{2,btp}$. A load charge pump 24 may also operate as a charge pump to force a floating low supply voltage $V_M$ to the difference between floating high supply voltage $V_P$ and rail voltage $V_{DD}$ (e.g., $V_M = V_P - V_{DD}$).

Tracking assist circuit 26 may include a constant current source that sinks a bias current $I_{bias}$ to ensure that $V_M = V_{in,CM} - (1-k)V_{DD}$. In operation, tracking assist circuit 26 may provide Class-A tracking such that floating high supply voltage $V_P$ and floating low supply voltage $V_M$ track negative variations in common mode voltage $V_{in,CM}$. Accordingly, tracking assist circuit 26 may enable off-state biasing (e.g., during phase $\varphi_2$) of bootstrap switches 10 at slightly below the voltage received at the signal input of a bootstrap switch 10. Further, tracking assist circuit 26 may minimize or avoid forward biasing of floating high-voltage well diodes, for example those well diodes between a source terminal of an n-type field effect transistor and the bulk of such transistor, or between a drain terminal of an n-type field effect transistor and the bulk of such transistor, by keeping floating low supply voltage $V_M$ lower than common mode voltage $V_{in,CM}$ during fast transitions of common mode voltage $V_{in,CM}$.

A source-follower transistor 30 of tracking assist circuit 26 may provide additional tracking, such that floating high supply voltage $V_P$ and floating low supply voltage $V_M$ track positive variations in common mode voltage $V_{in,CM}$.

Protection clamp 28 may comprise a series combination of one or more diode-connected p-type field-effect transistors coupled between floating high supply voltage $V_P$ and the output of the replica filter. Protection clamp 28 may operate to provide over-voltage protection during powering-down of bootstrap generation network 16. Protection clamp 28 may also operate to provide input tracking when main charge pump 22 and/or clocking to bootstrap generation network 16 is turned off.

Advantageously, bootstrap generation network 16 may generate floating high supply voltage $V_P$ and floating low supply voltage $V_M$, such that bootstrap clock signals $\varphi_{1,btp}$ and $\varphi_{2,btp}$ may vary between $V_M$ and $V_P$ and wherein $V_P$ is significantly larger than rail voltage $V_{DD}$, whereas sampling clock signals $\varphi_1$ and $\varphi_2$ may vary between 0 volts and rail voltage $V_{DD}$. Further, bootstrap generation network 16 may enable such beyond-the-rails signal sampling while providing adequate over-voltage protection within bootstrap generation network 16.

Accordingly, the systems and methods described above may enable an ultra-low-power beyond-the-rails switched-capacitor front end using low-voltage or high-voltage transistors (e.g., bootstrapped switches 10 and 12) for high voltage sensing, with input tracking for floating supply generation and over-voltage protection.

Further, the systems and methods described above may enable an ultra-low power charge-pump-based input-tracking level shifter circuit that provides floating supplies and clocks to a common-mode insensitive switched-capacitor front-end for over-voltage protection and highly linear sampling. The common-mode insensitive beyond-the-rails switched-capacitor front-end may operate on floating supplies and control signals/clocks, where the beyond-the-rails front-end protects the subsequent low-voltage, low-supply circuitry (e.g., downstream analog-to-digital converter) from the high voltage input. A charge-pump-based floating supply and clock generation circuitry may create floating supply rails and control signals and clocks with respect to beyond-the-rails input, wherein the tracking supplies and clocks may protect the low-voltage transistors used in the switched-capacitor front-end from the high input voltage.

In addition, the systems and methods described above may enable an auxiliary tracking assist circuit that assists the ultra-low-power charge-pump circuit with tracking fast input variations. For example, a class-A source-follower-based tracker assist circuit that may assist the floating supplies/clocks to tracking fast input variations.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing FIGURES and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a switched-capacitor analog front end comprising a plurality of switches for sampling an analog physical quantity; and
   a bootstrap generation network electrically coupled to the plurality of switches and configured to:
      generate a bootstrap sampling clock for controlling the plurality of switches; and
      generate a floating supply voltage for the bootstrap sampling clock based on the analog physical quantity.

2. The system of claim 1, wherein the bootstrap generation network is further configured to:
   receive a sampling clock powered from a rail voltage; and
   generate the bootstrap sampling clock based on the sampling clock;
   wherein the floating supply voltage is greater than the rail voltage.

3. The system of claim 1, wherein the bootstrap generation network comprises charge pump circuitry for generating the bootstrap sampling clock and the floating supply voltage.

4. The system of claim 3, wherein the bootstrap generation network comprises tracking assist circuitry to assist the charge pump circuitry in tracking the analog physical quantity in order to generate the bootstrap sampling clock and the floating supply voltage.

5. The system of claim 4, wherein the tracking assist circuit sinks a bias current in order to perform class-A tracking to track variations in the analog physical quantity.

6. The system of claim 4, wherein the tracking assist circuit comprises a source-follower configured to perform class-A tracking to track variations in the analog physical quantity.

7. The system of claim 3, wherein a voltage reference of the charge pump circuitry is generated by a replica filter path of a main filter path.

8. The system of claim 3, wherein a negative polarity of the floating supply voltage is adjusted by a load bias current to a level sufficiently lower than the analog physical quantity.

9. The system of claim 3, wherein a negative polarity of the floating supply voltage controls bulk terminals of n-type field effect transistor bootstrapped switches to minimize forward-biasing of bulk-to-source well diodes and bulk-to-drain well diodes during transitions of the analog physical quantity while the bootstrapped switches are off.

10. The system of claim 1, further comprising one or more diode-connected transistors arranged in series coupled between the floating supply voltage and an input for receiving the analog physical quantity.

11. The system of claim 1, wherein the analog physical quantity is a voltage.

12. The system of claim 11, wherein the voltage is indicative of an electrical current.

13. A method comprising, in a system comprising a switched-capacitor analog front end comprising a plurality of switches for sampling an analog physical quantity:
   generating a bootstrap sampling clock for controlling the plurality of switches; and
   generating a floating supply voltage for the bootstrap sampling clock based on the analog physical quantity.

14. The method of claim 13, further comprising:
   receiving a sampling clock powered from a rail voltage; and
   generating the bootstrap sampling clock based on the sampling clock;
   wherein the floating supply voltage is greater than the rail voltage.

15. The method of claim 13, further comprising generating the bootstrap sampling clock and the floating supply voltage with charge pump circuitry.

16. The method of claim 15, further comprising assisting the charge pump circuitry in tracking the analog physical quantity in order to generate the bootstrap sampling clock and the floating supply voltage.

17. The method of claim 16, wherein assisting the charge pump circuitry in tracking the analog physical quantity comprises sinking a bias current in order to perform class-A tracking to track variations in the analog physical quantity.

18. The method of claim 16, wherein assisting the charge pump circuitry in tracking the analog physical quantity comprises performing, with a source-follower, class-A tracking to track variations in the analog physical quantity.

19. The method of claim 15, further comprising generating a voltage reference of the charge pump circuitry by a replica filter path of a main filter path.

20. The method of claim 15, further comprising adjusting a negative polarity of the floating supply voltage by a load bias current to a level sufficiently lower than the analog physical quantity.

21. The method of claim 15, further comprising controlling, with a negative polarity of the floating supply voltage, bulk terminals of n-type field effect transistor bootstrapped switches to minimize forward-biasing of bulk-to-source well diodes and bulk-to-drain well diodes during transitions of the analog physical quantity while the bootstrapped switches are off.

22. The method of claim 13, wherein one or more diode-connected transistors are arranged in series coupled between the floating supply voltage and an input for receiving the analog physical quantity.

23. The method of claim 13, wherein the analog physical quantity is a voltage.

24. The method of claim 23, wherein the voltage is indicative of an electrical current.

25. A bootstrap generation network configured to electrically couple to a plurality of switches of a switched-capacitor analog front end for sampling an analog physical quantity, the bootstrap generation network comprising:
   circuitry configured to generate a bootstrap sampling clock for controlling the plurality of switches; and
   circuitry configured to generate a floating supply voltage for the bootstrap sampling clock based on the analog physical quantity.

* * * * *